Dec. 29, 1964 C. E. FOX 3,163,709

HOLLOW SOLDER TERMINAL HAVING A DRILL GUIDE OPENING

Filed Feb. 2, 1962

INVENTOR.
CARL E. FOX,
BY
Noel B. Hammond
AGENT.

3,163,709

HOLLOW SOLDER TERMINAL HAVING A DRILL GUIDE OPENING

Carl Edward Fox, Playa del Rey, Calif., assignor to Hughes Aircraft Company, Culver City, Calif., a corporation of Delaware Filed Feb. 2, 1962, Ser. No. 170,562
6 Claims. (Cl. 174—68.5)

The present invention relates to solder terminals for electrical components and, more particularly, to a hollow solder terminal having a shaped and treated opening that serves as a guide for a drill for removal of a component lead without unsoldering.

Electrical components such as resistors, capacitors, semiconductor diodes or the like, are frequently fastened to a circuit board by soldering lead wires or pigtails that extend axially from the component into hollow terminals mounted on the circuit board. This arrangement provides mechanical support of the component while making electrical connection thereto. In the event it is necessary to remove a component, the terminal is heated to melt the solder while force is simultaneously applied to the component lead in a direction to cause the lead to slide out of the terminal when the solder becomes molten. This procedure is difficult to perform, particularly when the components are mounted in a circuit assembly of the type referred to as sandwich or cordwood construction.

In circuit assemblies made by the sandwich or cordwood technique, the electrical components are mounted perpendicularly between two or more parallel circuit boards. The boards are provided with hollow solder terminals in corresponding or aligned positions and the components extend between the boards, the axial lead on one side of each component being soldered in the hole in a terminal on one board, and the axial lead on the other side of the component being soldered in the hole in a terminal on the other board. The final assembly resembles a sandwich with components stacked like cordwood. Should one of the components be defective, it is very difficult to unsolder the component. As an example, the defective component may be removed by heating the terminals on each side of the component and applying oppositely directed forces to the two leads simultaneously.

A component may be removed without unsoldering by drilling the component lead and solder from the hollow interior of the terminal. However, this may result in damage to the terminal so that it cannot be re-used for the installation of a new component. The drill may bite into the terminal itself and cause it to rotate, thereby loosening it from the circuit board, or a portion of the interior wall of the terminal may be drilled away. It may be difficult to start a drill if the solder or component lead obstructs the opening of the hollow terminal, and particularly if the solder presents an outwardly curved surface to the drill.

Accordingly, it is an object of the present invention to provide a hollow solder terminal from which a component lead and solder may be easily drilled and which may be re-used for the installation of a new component.

In accordance with these and other objects of the invention there is provided a hollow solder terminal having a shaped and treated opening that serves as a guide for a drill for removal of a component lead without unsoldering. At one end of the terminal, the internal bore is flared to a conical shape with a predetermined angle suitable for use as a guide for a drill. The conical portion of the bore and a portion of the bore adjacent thereto is treated to prevent the adherence of solder so that solder will not form an obstruction to the entrance of a drill. This treatment may be a coating of oil, ceramic, epoxy resin, or an appropriate metal and the coating may be applied by spraying, plating, or dipping. Alternatively, the treatment may be a hardening of that area of the terminal by local case hardening. In soldering a component to the terminal, the component lead is prevented from extending into the conical portion of the bore and a portion of the bore adjacent thereto so that the end of the component lead does not form an obstruction to the entrance of a drill.

The following specification and the accompanying drawings respectively describe and illustrate exemplifications of the present invention. Consideration of the specification and the drawings will provide an understanding of the invention, including the novel features and objects thereof. Like reference characters are used to designate like parts throughout the figures of the drawings.

Figures 1, 2, 3:
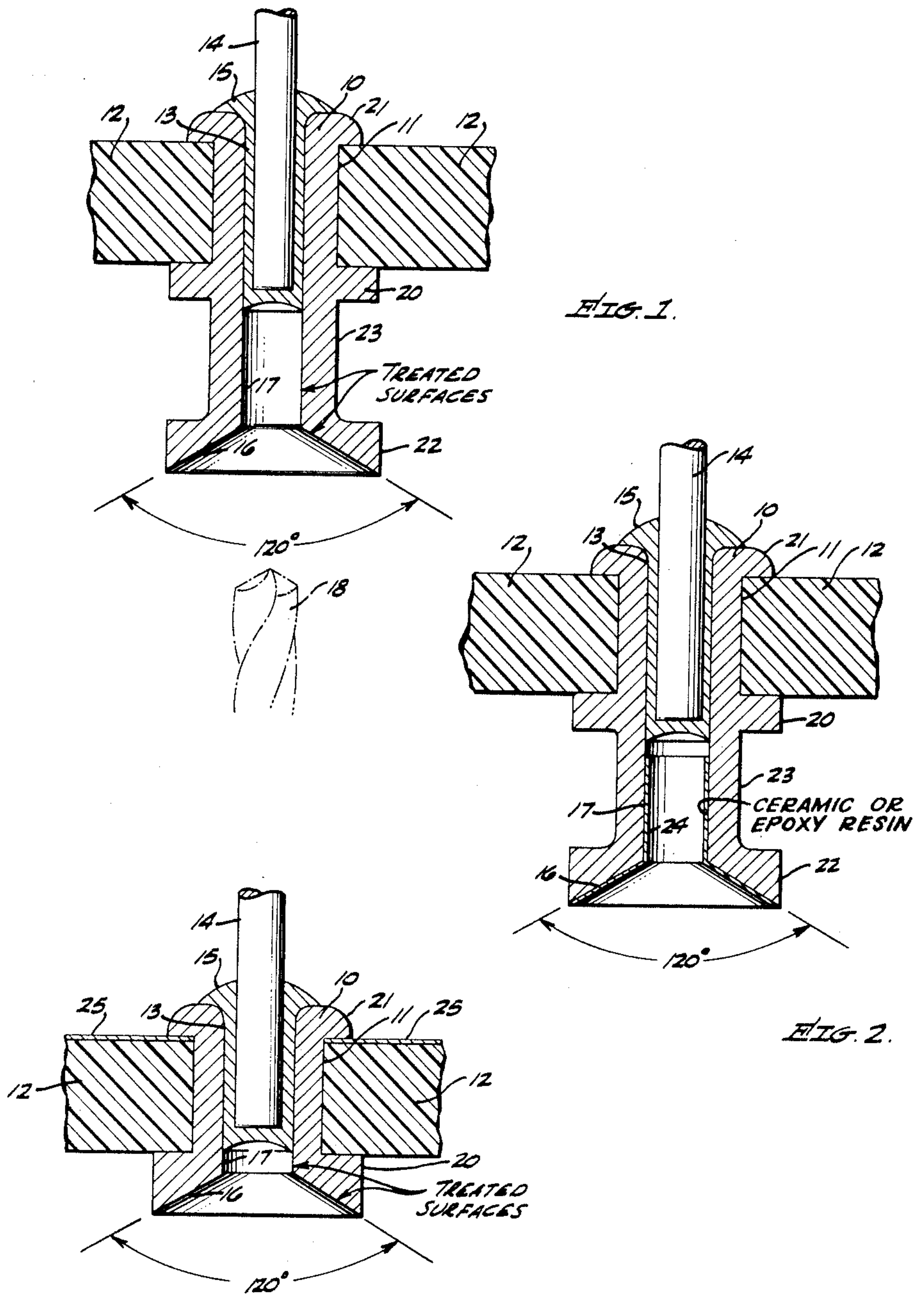
FIG. 1 is an elevational view in cross-section of an embodiment of a terminal having a shaped and treated opening in accordance with the invention.
FIG. 2 is an elevational view in cross-section of another embodiment of a terminal in accordance with the invention in which a coating is provided in the shaped opening.
FIG. 3 is an elevational view in cross-section of a third embodiment of a terminal in accordance with the invention illustrating the shaped and treated opening applied to a shortened terminal.

Referring now to FIG. 1 of the drawing, there is illustrated a solder terminal 10 mounted in a hole 11 in a circuit board 12 and having a bore 13 in which the lead 14 of an electrical component is affixed by solder 15. The bore 13 of the terminal 10 has a conical portion 16 opening outwardly at the lower end thereof. The conical portion 16 of the bore 13 and the adjoining portion 17 are treated to prevent the adherence of solder thereto and thus provide a solder-free opening to serve as a guide for a drill such as a twist drill 18 or the like. In this manner, the solder 15 and component lead 14 may be removed from the terminal 10 without the application of heat to melt the solder 15.

The terminal 10 is of a generally tubular construction and is made of conductive metal such as brass or steel. The circuit board 12 is made of a nonconductive or insulating material and the terminal 10 is affixed in the hole 11 provided therein by means of a centrally disposed annular flange 20 and a crimped or swaged portion 21. If desired, the swaged portion 21 may be flared rather than completely crimped as illustrated. The terminal 10 is provided with a second flange 22 displaced from the first flange 20 to form a neck portion 23 therebetween to which interconnection wires may be soldered. In addition, the terminal 10 may also be in contact with printed wiring on either or both sides of the circuit board 12, if desired.

The conical portion 16 of the bore 13 in the terminal 10 has an included angle that substantially matches the angle of the cutting edges of the drill 18. In this manner, the drill 18 will readily center itself in the conical portion 16 and be guided into the bore 13 thereby. If the angle is too small, the drill 18 chatters and cuts into the sides of the terminal 10, whereas, if the angle of the conical portion 16 is too large, the drill 18 tends to wander and not center itself. The usual angle for the cutting edges of the drill 18 will be found to be approximately 120°. Accordingly, the included angle of the conical portion 16 of the bore 13 in the terminal 10 will normally be substantially 120°. The diameter of the drill 18 is ordinarily substantially equal to, or slightly smaller than the diameter of the bore 13 in the terminal 10.

The conical portion 16 and the adjacent portion 17 of the bore 13 in the terminal 10 are treated to prevent or inhibit the adherence of solder. This treatment may take several forms. The terminal 10, if made of steel may be hardened at the treated surfaces 16 and 17 by local case hardening. The hardening process had the additional advantage that it also tends to prevent the drill 18 from removing metal from the terminal 10. As an alternative, the adherence of solder may be prevented by adding a thin film of oil or the like to the surfaces 16 and 17 to be treated. In the absence of solder protruding into the conical portion 16 of the bore 13, the drill 18 easily enters the bore 13 and drills out both the component lead 14 and the solder 15, leaving the bore 13 perfectly sized and ready for the installation of a new component. The end of the component lead 14 must not be inserted too far into the bore 13, otherwise it will protrude into the conical portion 16 and interfere with the centering of the drill 18.

Referring now to FIG. 2, there is shown a terminal 10 substantially identical to that of FIG. 1 except that the treated surfaces, namely, the conical portion 16 of the bore 13 and the adjacent portion 17, are provided with a coating 24 to which solder will not adhere. This coating 24 may be ceramic, an appropriate metal such as aluminum if lead-tin solder is used with a resin flux, epoxy resin, or the like. The coating 24 may be applied by electroless deposition, plating, dipping, spraying, or the like. If the coating 24 is a plated layer of metal to which solder will not adhere, then the coating 24 will last indefinitely although the bore 13 of the terminal 10 is drilled out many times.

In the terminal 10 of FIGS. 1 and 2, the conical portion 16 of the bore 13 may be eliminated, if desired, provided that the solder-free adjacent portion 17 is sufficiently along to serve as an adequate guide for the drill 18. However, more care will be required to insert the drill 18 into the bore 13 without the centering effect produced by the conical portion 16.

FIG. 3 illustrates a short type of terminal 10 in which the interconnecting wiring takes the form of a printed circuit 25 on the surface of the circuit board 12 to which the terminal 10 is crimped or swaged. If desired, the terminal 10 may also be soldered to the printed circuit 25. With the terminal 10 of FIG. 3, the length of the bore 13 is reduced and, consequently, the component lead 14 cannot be inserted as far into the bore 13 without interfering with the starting of the drill 18. The treated surfaces 16 and 17 are hardened or coated with oil, as described above in connection with FIG. 1. If desired, the terminal 10 of FIG. 3 may be provided with a coating 24 of ceramic, or appropriate metal, epoxy resin or the like, as described in connection with FIG. 2.

Thus, there has been described a hollow solder terminal from which a component lead and solder may be easily drilled and which may be re-used for the installation of a new component. The terminal is provided with a shaped and treated opening that serves as a guide for a drill.

While only three embodiments of the invention have been shown and described, other modifications may be made and it is intended that the foregoing disclosure shall be considered only as illustrative of the principles of this invention and not construed in a limiting sense.

What is claimed is:

1. A solder terminal for mounting an electrical component to a circuit board comprising: a generally tubular electrically conductive body adapted to be fastened in a hole in a circuit board and having a bore extending completely through the center thereof, said bore having a conical portion opening outwardly at one end thereof with a predetermined angle, said conical portion and a portion of said bore adjacent thereto having a treated surface to which solder will not adhere, the remainder of said bore having a surface to which solder will adhere, thereby providing a solder-free opening to serve as a guide for a drill for removal of an electrical component soldered to said terminal.

2. A solder terminal for mounting an electrical component to a circuit board comprising: a generally tubular electrically conductive body adapted to be fastened in a hole in a circuit board and having a bore extending completely through the center thereof, said bore having a conical portion opening outwardly at one end thereof with an included angle of substantially 120°, said conical portion and a portion of said bore adjacent thereto having a coating of ceramic to which solder will not adhere, the remainder of said bore having a surface to which solder will adhere, thereby providing a solder-free opening to serve as a guide for a drill for removal of an electrical component soldered to said terminal.

3. A solder terminal for mounting an electrical component to a circuit board comprising: a generally tubular electrically conductive body adapted to be fastened in a hole in a circuit board and having a bore extending completely through the center thereof, said bore having a conical portion opening outwardly at one end thereof with an included angle of substantially 120°, said conical portion and a portion of said bore adjacent thereto having a coating of a metal to which the solder being used will not adhere, the remainder of said bore having a surface to which solder will adhere, thereby providing a solder-free opening to serve as a guide for a drill for removal of an electrical component soldered to said terminal.

4. A solder terminal for mounting an electrical component to a circuit board comprising: a generally tubular electrically conductive body adapted to be fastened in a hole in a circuit board and having a bore extending completely through the center thereof, said bore having a conical portion opening outwardly at one end thereof with an included angle of substantially 120°, said conical portion and a portion of said bore adjacent thereto having a hardened surface to which solder will not adhere, the remainder of said bore having a surface to which solder will adhere, thereby providing a solder-free opening to serve as a guide for a drill for removal of an electrical component soldered to said terminal.

5. A solder terminal for mounting an electrical component to a circuit board comprising: a generally tubular electrically conductive body adapted to be fastened in a hole in a circuit board and having a bore extending completely through the center thereof, said bore having a conical portion opening outwardly at one end thereof with an included angle of substantially 120°, said conical portion and a portion of said bore adjacent thereto having a coating of epoxy resin to which solder will not adhere, the remainder of said bore having a surface to which solder will adhere, thereby providing a solder-free opening to serve as a guide for a drill for removal of an electrical component soldered to said terminal.

6. A circuit assembly comprising a circuit board having an aperture therein, a generally tubular electrically conductive body fastened in said aperture and having a bore extending completely through the center thereof, said bore having a conical portion opening outwardly at one end thereof with an included angle of substantially 120°, said conical portion and a portion of said bore adjacent thereto having a treated surface to which solder will not adhere, the remainder of said bore having a surface to which solder will adhere, a component having a connection lead positioned within the bore of said electrically conductive body inserted from the side opposite said conical portion and extending only into the portion to which solder will adhere, and a solder coupling affixing said component lead to said conductive body.

References Cited in the file of this patent

UNITED STATES PATENTS

| | | |
|---|---|---|
| 1,831,534 | Judisch | Nov. 10, 1931 |
| 2,416,693 | Hills | Mar. 4, 1947 |
| 2,473,887 | Jennings et al. | June 21, 1949 |
| 2,846,659 | Hinspater et al. | Aug. 5, 1958 |
| 2,915,678 | Frazier et al. | Dec. 1, 1959 |